United States Patent
Kamkar et al.

(10) Patent No.: US 10,424,311 B2
(45) Date of Patent: Sep. 24, 2019

(54) AUTO-MUTE AUDIO PROCESSING

(71) Applicant: Cirrus Logic International Semiconductor Ltd., Edinburgh (GB)

(72) Inventors: Shafagh Kamkar, Austin, TX (US); Bruce Duewer, Round Rock, TX (US); Dylan Hester, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 104 days.

(21) Appl. No.: 15/706,093

(22) Filed: Sep. 15, 2017

(65) Prior Publication Data

US 2018/0218744 A1 Aug. 2, 2018

Related U.S. Application Data

(60) Provisional application No. 62/452,012, filed on Jan. 30, 2017.

(51) Int. Cl.
| | |
|---|---|
| *G10L 19/22* | (2013.01) |
| *G10L 19/00* | (2013.01) |
| *G10L 19/16* | (2013.01) |
| *G06F 3/16* | (2006.01) |
| *G10L 19/008* | (2013.01) |
| *G11B 27/10* | (2006.01) |
| *H03G 3/00* | (2006.01) |
| *H03G 3/34* | (2006.01) |

(52) U.S. Cl.
CPC ............ *G10L 19/167* (2013.01); *G06F 3/165* (2013.01); *G10L 19/008* (2013.01); *G10L 19/22* (2013.01); *G11B 27/10* (2013.01); *H03G 3/002* (2013.01); *H03G 3/342* (2013.01); *H03G 3/348* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,768,291 A | * | 6/1998 | Kelton | H04L 1/0057 375/331 |
| 5,799,039 A | * | 8/1998 | Laird | H04B 14/068 375/244 |
| 6,340,940 B1 | | 1/2002 | Melanson | |
| 6,958,717 B1 | * | 10/2005 | Minogue | H03M 3/50 341/100 |
| 9,569,166 B2 | * | 2/2017 | Tachimori | G06F 3/162 |

(Continued)

FOREIGN PATENT DOCUMENTS

| | | |
|---|---|---|
| EP | 1406261 A1 | 4/2004 |
| KR | 20150115308 A | 10/2015 |
| WO | 2017/082050 A1 | 5/2017 |

*Primary Examiner* — Shreyans A Patel
(74) *Attorney, Agent, or Firm* — Norton Rose Fulbright US LLP

(57) ABSTRACT

An audio processing circuit may have a first path for processing multi-bit audio signals in parallel with a second path for processing single-bit audio signals. The parallel paths may share a common input node for receiving audio data and a common output node for reproducing audio at a transducer. Each path may have a volume control for adjusting an output of the path. The audio processing circuit may determine a type of an audio signal received at the input. The path not corresponding to the detected type of the audio signal is muted, and the path corresponding to the detected type of audio signal is unmuted.

34 Claims, 7 Drawing Sheets

(56) References Cited

U.S. PATENT DOCUMENTS

| | | | |
|---|---|---|---|
| 10,062,391 B2* | 8/2018 | Yamamoto | G10L 21/0208 |
| 2004/0213350 A1 | 10/2004 | Frith et al. | |
| 2004/0234000 A1* | 11/2004 | Page | H04J 3/00 |
| | | | 375/259 |
| 2005/0113058 A1* | 5/2005 | Gosieski, Jr. | H04H 20/61 |
| | | | 455/345 |
| 2005/0141659 A1* | 6/2005 | Capofreddi | H04L 25/03114 |
| | | | 375/348 |
| 2005/0213693 A1* | 9/2005 | Page | H04L 7/0008 |
| | | | 375/354 |
| 2015/0107442 A1 | 4/2015 | Tachimori | |
| 2016/0086611 A1 | 3/2016 | Tachimori | |
| 2016/0322056 A1* | 11/2016 | Yamashita | G11B 20/00007 |
| 2017/0300290 A1* | 10/2017 | Hester | G11B 27/038 |
| 2018/0307555 A1* | 10/2018 | Zwart | H04L 1/0045 |

* cited by examiner

AUTO-MUTE AUDIO PROCESSING

CROSS-REFERENCE TO RELATED PATENT APPLICATIONS

This application claims the benefit of priority of U.S. Provisional Patent Application No. 62/452,012 to Shafagh Kamkar filed Jan. 30, 2017 and entitled "PCM and DOP Auto-Mute/Auto-switch Circuit," which is incorporated by reference herein.

FIELD OF THE DISCLOSURE

The instant disclosure relates to audio signal processing. More specifically, portions of this disclosure relate to processing of multi-bit and single-bit audio signals.

BACKGROUND

Many formats exist for digitally encoding analog audio signals. For example, analog audio signals can be digitally encoded in a multi-bit format, such as digital pulse-code modulation (PCM). Alternatively, analog audio signals may be digitally encoded in a single-bit format, such as direct stream digital (DSD). A DSD signal may be organized in a PCM frame in a DSD over PCM (DOP) format. Thus, PCM signals and DoP signals may share a similar data structure 100, as illustrated in FIG. 1. For example, audio signals may be encoded and transmitted in a 24-bit PCM frame 102. Similarly, audio signals may be encoded as DoP data and transmitted in the same frame structure 102. In order to distinguish between DoP data and PCM data, each DoP frame may be headed by an 8-bit DSD marker 104, followed by 16 bits of DSD audio data 106. Multiple channels of audio data, such as a left channel and a right channel, may be encoded and transmitted using DoP.

Processing audio-signals encoded in one format with audio processing circuitry for processing of audio signals encoded in another format can cause reproduction of undesirable noise. For example, if multi-bit signals are processed using single-bit audio signal processing circuitry, undesirable noise is reproduced and heard by a user. Likewise, if single-bit audio signals are processed using multi-bit audio signal processing circuitry undesirable noise is reproduced and heard by a user. When the DSD marker 104 of FIG. 1 is processed using circuitry for processing PCM audio signals, undesirable noise is reproduced and heard by a user. Furthermore, switching between processing audio signals of different formats, such as PCM audio signals and DoP audio signals, can create transient artifacts, inducing reproduction of undesirable noise.

Shortcomings mentioned here are only representative and are included simply to highlight that a need exists for improved electrical components, particularly for audio signal processing employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

An audio data stream may be received by an audio decoding circuit with separate audio processing paths for processing multi-bit and single-bit audio signals having a shared input node, decoded using an appropriate audio processing path, and output from the audio decoding circuit at a shared output node. The audio data stream may include different types of audio signals, such as multi-bit audio signals and single-bit audio signals, at different times. To correctly decode the audio data stream, an audio decoding circuit may detect a type of an audio signal received in the audio data stream and activate an audio processing path for that type of audio signal. The audio-processing circuit may then monitor the audio signal for changes in the type of audio signal. If the audio signal type changes, the audio-processing circuit may deactivate the currently activated audio processing path and activate the audio processing path corresponding to the detected type of the audio signal. After identifying an appropriate audio processing path, the incorrect audio processing path may be muted to prevent reproduction of noise caused by the incorrect decoding of the audio data stream. In some embodiments, a circuit may transition from a state wherein a first path is muted and a second path is unmuted, to a state wherein both first and second paths are muted, and then to a state wherein the first path is unmuted and the second path is muted. This transition from states may occur based on detection of a change from multi-bit to single-bit audio signals in the audio data stream, or vice versa.

An audio processing circuit may decode an audio data stream that is a multi-bit audio signal using a multi-bit audio processing path coupled to an input node shared with a single-bit audio processing path. The audio processing circuit may detect when the audio stream switches from the multi-bit audio signal to a single-bit audio signal. For example, the audio processing circuit may simultaneously decode the audio data stream in the single-bit audio processing path while processing the audio data stream in the multi-bit audio processing path. The audio processing circuit may analyze the multi-bit audio signal to detect a marker byte, or a series of marker bytes, in a predetermined number of frames, indicating that the audio data stream is a single-bit audio signal instead of a multi-bit audio signal.

When such a switch is detected, the audio processing circuit may mute the multi-bit audio processing path. The audio processing circuit may immediately mute the multi-bit audio processing path upon detection of a transition to a single-bit audio signal, for example upon detection of a marker byte, or series of marker bytes, indicating that the audio data stream is a single-bit audio signal, or it may gradually lower the volume of the multi-bit audio processing path until it is muted, following detection of such a transition. The output of the multi-bit audio processing path of the audio processing circuit may be amplified during switching from the multi-bit audio processing path to the single-bit audio processing path for driving a transducer to reproduce audio of the decoded audio stream. After muting the multi-bit audio processing path, and prior to decoding the audio data stream using the single-bit audio processing path, both the single-bit and the multi-bit audio processing path may be muted during a transition from outputting a processed audio signal of the multi-bit audio processing path to outputting a processed audio signal of the single-bit processing path. After muting the multi-bit audio processing path, the audio processing circuit may proceed to decode the audio data stream using the single-bit audio processing path. In some embodiments, the audio processing circuit may contain a single configurable audio processing path that may be configured to operate as a single-bit audio processing path or a multi-bit audio processing path.

An audio processing circuit may decode an audio data stream as a single-bit audio signal using a single-bit audio processing path coupled to an input node shared with a multi-bit audio processing path. The audio processing circuit may detect when the audio data stream switches from the single-bit audio signal to a multi-bit audio signal. For example, the audio processing circuit may analyze the multi-bit audio signal to detect a missing marker byte indicating that the audio data stream is a multi-bit audio signal instead of a single-bit audio signal. The audio processing circuit may immediately mute the signal upon detection of a transition to a multi-bit audio signal, for example upon detection of a missing marker byte indicating that the audio data stream is a multi-bit audio signal, or it may gradually lower the volume following detection of such a transition.

When such a switch is detected, the audio processing circuit may mute the single-bit audio processing path. The audio processing circuit may immediately mute the single-bit audio processing path upon detection of a transition to a multi-bit audio signal, for example upon detection of a missing marker byte, or it may gradually lower the volume of the single-bit processing path until it is muted, following detection of such a transition. The output of the single-bit audio processing path of the audio processing circuit may be amplified during switching from the single-bit audio processing path to the multi-bit audio processing path for driving a transducer to reproduce audio of the decoded audio stream. After muting the single-bit audio processing path, and prior to decoding the audio data stream using the multi-bit audio processing path, both the single-bit and the multi-bit audio processing path may be muted, during a transition from outputting a processed audio signal of the single-bit audio processing path to outputting a processed audio signal of the multi-bit audio processing path. After muting the single-bit audio processing path, the audio processing circuit may proceed to decode the audio data stream using the multi-bit audio processing path.

An audio processing circuit for performing the steps disclosed herein may include a multi-bit audio processing path and a single-bit audio processing path. Alternatively or additionally, the audio processing circuit may include a single audio processing path that is configurable to operate as either a single-bit audio processing path or a multi-bit audio processing path. An audio controller, contained within an audio processing circuit or individually, may be configured to perform the steps described herein.

The audio processing circuit described herein may be used, in conjunction with a digital-to-analog converter (DAC), in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like. Such an audio processing circuit may allow devices to process multiple different formats of digitally encoded audio signals while reducing the amount of error exhibited in audio produced from such devices.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Processing multi-bit digital audio signals and single-bit digital audio signals may require different signal processing methods and equipment. When multi-bit audio signals are processed as single-bit audio signals or single-bit audio signals are processed as multi-bit audio signals, undesirable noise is reproduced and heard by a user. An audio processing circuit may include parallel processing paths for processing single-bit audio signals and multi-bit audio signals received from a shared input node and output to a shared output node. For example, when a received audio data stream is determined to be a multi-bit audio signal by the audio processing circuit, a single-bit audio processing path may be muted, and a multi-bit audio processing path may be unmuted, to allow the processed audio signal to be output from the multi-bit audio-processing path and but not from the single-bit audio processing path. Likewise, when an audio data stream is determined to be a single-bit audio signal by the audio processing circuit, a multi-bit audio processing path may be muted and a single-bit audio processing path may be unmuted to allow the processed audio signal to be output from the single-bit audio processing path but not from the multi-bit audio processing path. Alternatively or additionally, upon a determination that an audio data stream is a single-bit audio signal, an output of a single-bit audio processing path may be selected for output from the audio processing circuit, and upon determination that an audio data stream is a multi-bit audio signal, an output of a multi-bit audio processing path may be selected for output from the audio processing circuit.

Figure 1:
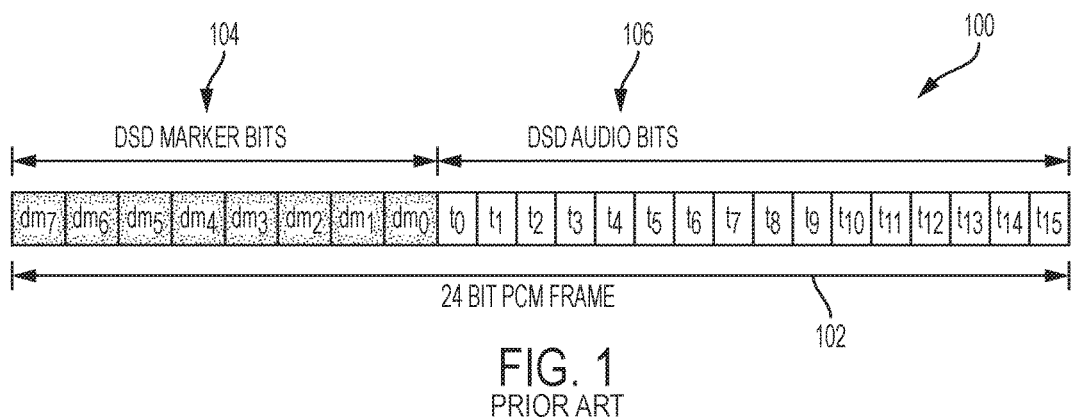
FIG. 1 is an illustration of an example frame structure for a frame of a multi-bit or single-bit digital audio signal according to the prior art.
Figure 2:
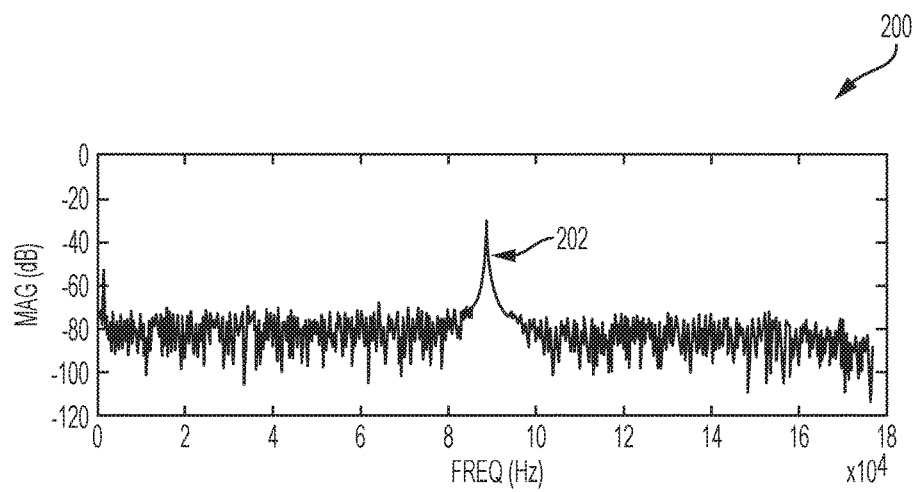
FIG. 2 is an example graph of a frequency response of a single-bit signal processed using a multi-bit signal processing path.

When a single-bit audio signal is erroneously processed as a multi-bit audio signal or a multi-bit audio signal is erroneously processed as a single-bit audio signal, noise is reproduced and negatively impacts the user. FIG. 2 is a graph 200 of a frequency response 202 of a single-bit audio signal processed using a multi-bit audio processing path. The frequency response 202 peaks at around 88.2 kHz indicating a substantial level of noise introduced through processing the single-bit audio signal using a multi-bit audio processing path. The noise is introduced, for example, if a DoP signal is processed using a PCM audio processing path. The introduction of such noise may be mitigated by monitoring a type of a received audio signal and automatically muting an audio processing path not corresponding to a type of the received audio signal.

Figure 3:
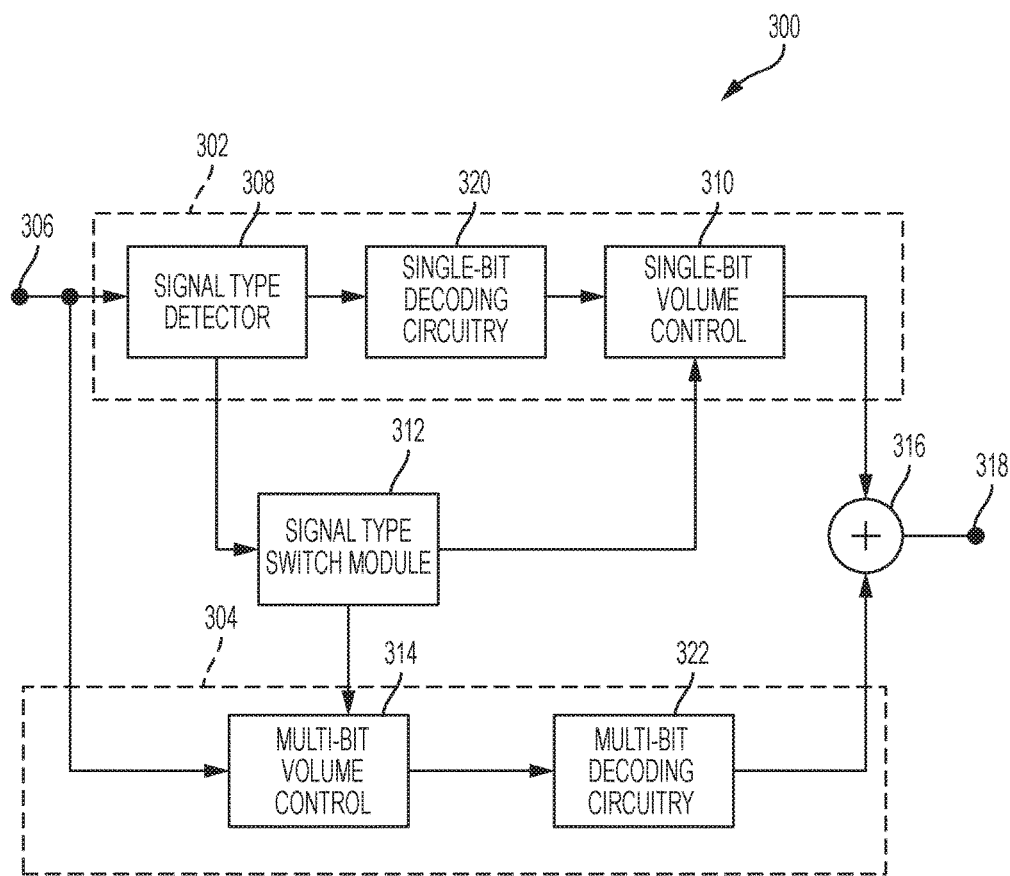
FIG. 3 is an example schematic block diagram illustrating an auto-mute audio processing path selection circuit according to some embodiments of the disclosure.

An audio processing circuit may process single-bit and multi-bit digital audio signals for conversion into analog audio signals by a digital-to-analog converter (DAC). A multi-path audio processing circuit 300, illustrated in FIG. 3, may have multiple paths for processing different types of digital audio signals. The audio processing circuit 300 may include a first audio processing path 302 for processing single-bit audio signals, such as DoP signals, and a second audio processing path 304 for processing multi-bit audio signals, such as PCM signals. Alternatively, an audio processing circuit may have a single configurable path (not pictured) for processing multiple types of digital audio signals. The audio processing circuit 300 may have a common input node 306 for receiving an audio data stream that may include single-bit digital audio signals and multi-bit digital audio signals.

An audio signal received at the common input node 306 is decoded in the first audio processing path 302 and the second audio processing path 304. The first audio processing path 302 may include an audio signal type detector 308, for detecting that the audio signal is a single-bit audio signal. Alternatively, a single-bit audio signal detector may be located in the second path 304 or outside the first path 302 and the second path 304. When a signal type is detected, the signal type detector 308 may inform a signal type switch module 312 of the signal type. The signal type switch module 312 may then mute the appropriate volume control module. For example, if the signal type detector 308 detects that a signal is a single-bit signal, the signal type switch module 312 may mute the multi-bit volume control module 314. Additionally, the signal type switch module 312 may unmute, or increase the volume of, the single-bit volume control module 310. The audio signal may then be decoded by the single-bit decoding circuitry 320 and output to the summer 316. If the signal type detector 308 detects a signal that is a multi-bit signal, the signal type switch module 312 may mute the single-bit volume control module 310. Additionally, the signal type switch module 312 may unmute, or increase the volume of, the multi-bit volume control module 314. The audio signal may then be processed using the multi-bit decoding circuitry 322 and output to the summer 316. The summer 316 may add the signal of the unmuted path to the signal of the muted path, effectively outputting the signal of the unmuted path at output 318. Thus, a received audio data stream may be passed from the single input 306 to both processing paths 302, 304, and then passed from the appropriate processing path to the summer 316 for output at output 318.

Figure 4:
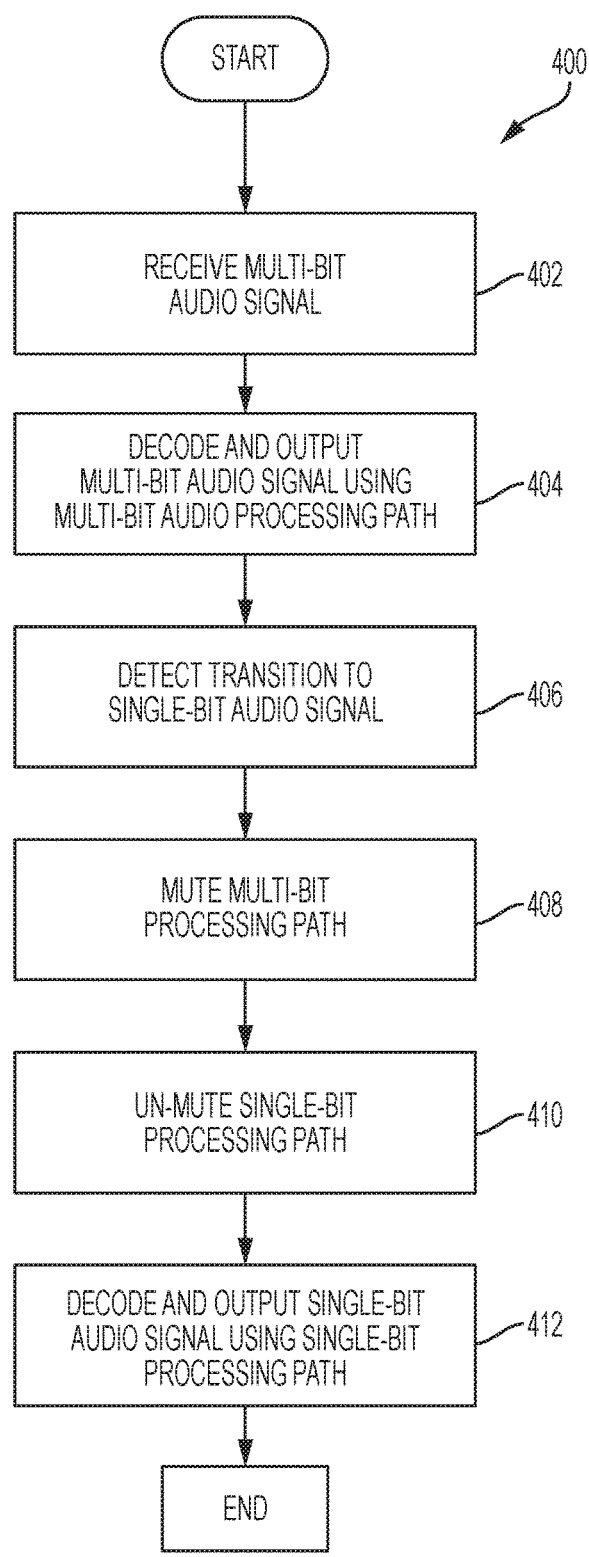
FIG. 4 is an example flow chart illustrating a method for muting a multi-bit audio processing path upon detection of a single-bit audio signal according to some embodiments of the disclosure.

An audio processing circuit may monitor a received audio data stream to determine a signal type and may automatically mute an audio processing path based on the signal type of the received signal. A method 400 for selecting a single-bit audio processing path upon detection of a single-bit audio signal is illustrated in FIG. 4. The method 400 may begin, at step 402, with receiving a multi-bit audio signal. For example, an audio data stream may be received that is a PCM audio signal. The multi-bit audio signal may be processed, at step 404, using a multi-bit audio signal processing path.

At step 406, a transition of the audio data stream to a single-bit audio signal may be detected. Such a transition may be detected by detecting a presence of a DSD marker. An audio processing circuit may by default process a signal as a multi-bit audio signal, in the absence of an indicator that the signal is a single-bit audio signal. Detection of a transition may require detection of multiple consecutive frames, for example 32 consecutive frames, containing DoP marker bytes.

After a transition is detected, at step 406, the multi-bit audio processing path may be muted at step 408. The multi-bit audio processing path may be muted instantaneously upon detection of a transition, or a volume of the multi-bit audio processing path may be gradually reduced until it is muted. Muting the multi-bit audio processing path may prevent a single-bit audio signal from being processed by a multi-bit audio processing path and output from the audio processing circuit, such as by buffering a portion of the audio signal in the detector. While switching from the multi-bit audio processing path to the single-bit audio processing path, the output of the multi-bit audio processing path may be amplified for driving a transducer to reproduce audio of the processed audio data stream. Following muting of the multi-bit audio processing path and prior to unmuting the single-bit audio processing path, the audio processing circuit may be in a state where both the multi-bit and single-bit audio processing paths are muted. The single-bit audio processing path may then be unmuted at step 410. A volume of the single bit audio processing path may be raised to a desired volume level instantaneously or may be gradually increased until a desired volume level has been reached. After the single-bit audio processing path is unmuted at step 410, the single-bit audio signal may be decoded and output from the audio processing circuit using the single-bit audio processing path. Thus, a multi-bit audio processing path may be automatically muted upon detection of a transition of an audio data stream from a multi-bit audio signal to a single-bit audio signal, and the single-bit audio signal may be processed using a single-bit audio processing path.

Figure 5:
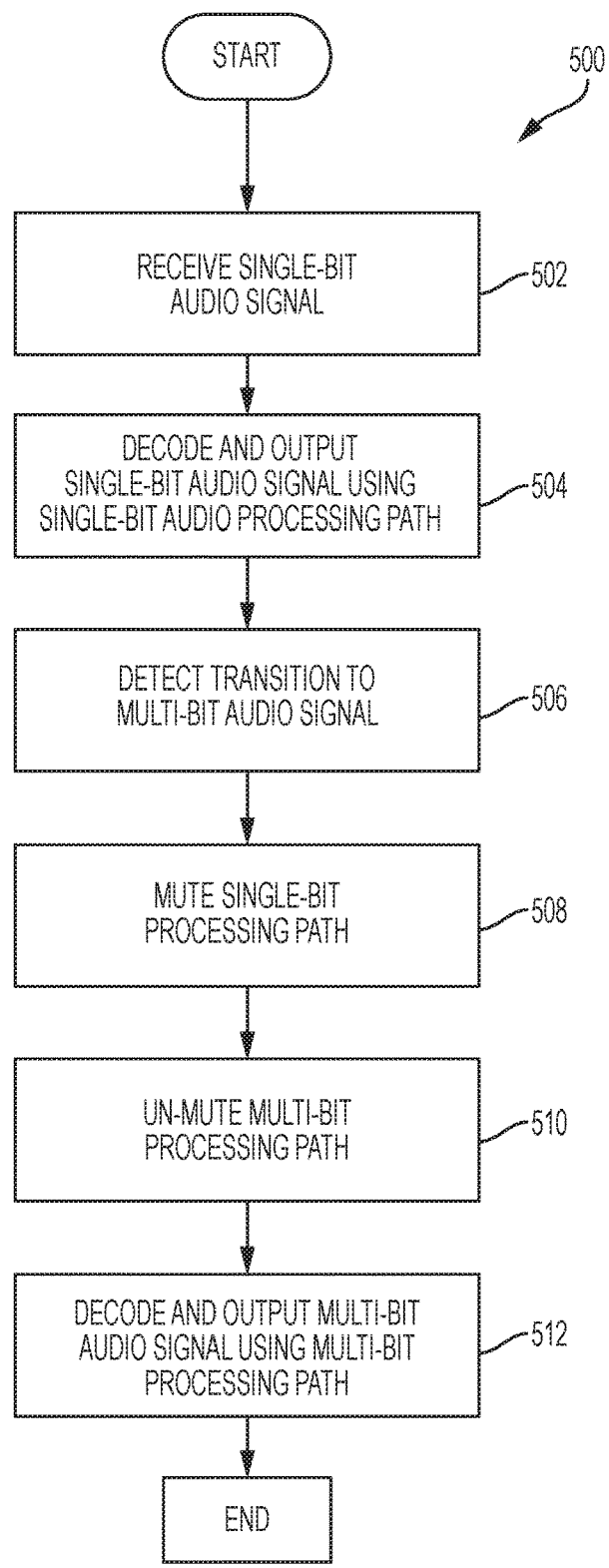
FIG. 5 is an example flow chart illustrating a method for muting a single-bit audio processing path upon detection of a multi-bit audio signal according to some embodiments of the disclosure.

Likewise, an audio processing circuit receiving and processing a single-bit audio signal may detect a transition from a single-bit audio signal to a multi-bit audio signal and, in response, may mute a single-bit audio processing path. A method 500 for selecting a multi-bit audio processing path upon detection of a multi-bit audio signal is illustrated in FIG. 5. The method 500 may begin, at step 502, with receiving a single-bit audio signal, such as a DoP audio signal. The single-bit audio signal may be processed, at step 504, using a single-bit audio signal processing path.

At step 506, a transition of the audio data stream to a multi-bit audio signal is detected. Such a transition may be detected by detecting an absence of an indicator intended to indicate that the audio signal is a single-bit audio signal. For example, a transition from a DoP audio signal to a PCM audio signal may be detected by an absence of a single DoP marker byte in a frame, the absence indicating that the signal is a PCM signal.

After a transition is detected, at step 506, the single-bit audio processing path is muted at step 508. The single-bit audio processing path may be muted instantaneously upon detection of a transition to a multi-bit audio signal, or a volume of a single-bit audio processing path may be gradually reduced until it is muted. Muting the single-bit audio processing path may prevent a multi-bit audio signal from being processed by a single-bit audio processing path and output from the audio processing circuit. While switching from the single-bit audio processing path to the multi-bit audio processing path, the output of the single-bit audio processing path may be amplified for driving a transducer to reproduce audio of the processed audio data stream. The multi-bit audio processing path may then be unmuted at step 510. After the multi-bit audio processing path is unmuted at step 510, the multi-bit audio signal may be decoded using the multi-bit audio processing path. Thus, a single-bit audio processing path may be automatically muted upon detection of a transition of an audio data stream from a single-bit audio signal to a multi-bit audio signal, and the multi-bit audio signal may be processed using a multi-bit audio processing path and output from the audio processing circuit.

Figure 6:
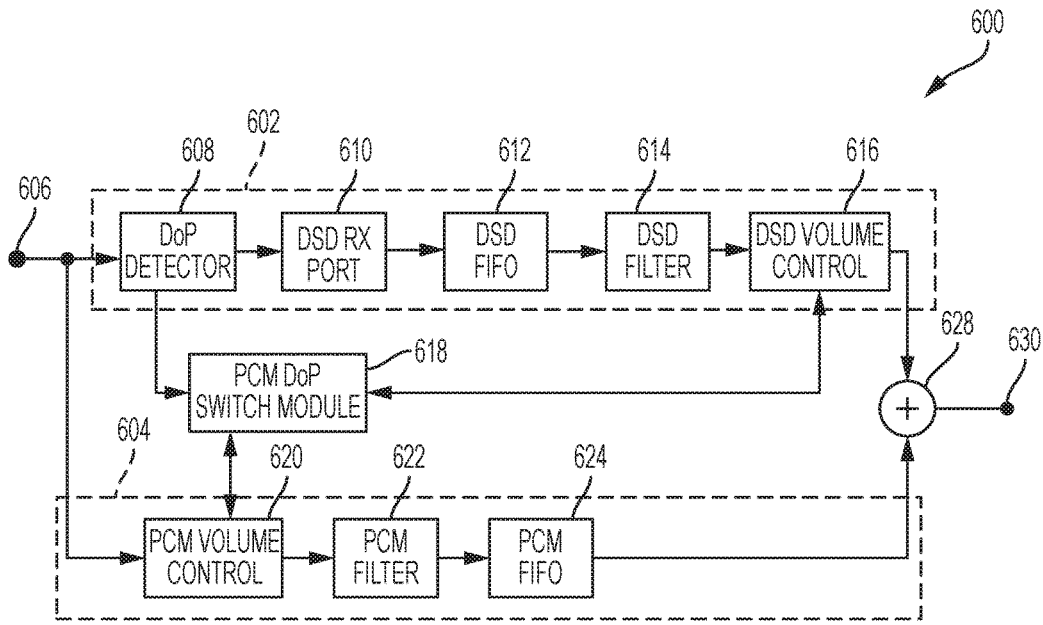
FIG. 6 is another example schematic block diagram illustrating an auto-mute audio path selection circuit according to some embodiments of the disclosure.

An audio processing circuit with a common input and output may include distinct processing paths for processing DoP digital audio signals and PCM digital audio signals. FIG. 6 is an illustration of an example audio processing circuit 600 having a first audio processing path 602 for processing DoP audio signals and a second audio processing path 604 for processing PCM audio signals. The audio processing circuit 600 may receive an audio data stream at common input node 606. The common input node 606 may be a three-wire serial digital audio port or other port for receiving a digital audio signal. The audio data stream may then pass from the input node 606 to the first audio processing path 602 for processing DoP audio signals and the second audio processing path 604 for processing PCM audio signals.

In the first audio processing path 602, the audio data stream may be passed through a DoP detector 608 to search frames of the audio data stream for marker bytes indicating that the audio data stream is a DoP audio signal. If the DoP detector 608 detects a sufficient number of frames including DoP marker bytes, for example 32 consecutive frames, the DoP detector 608 may inform the PCM DoP switch module 618 that the audio data stream is a DoP signal. In some embodiments, when multiple channels of data are being processed, 32 consecutive marker bytes must be detected on all channels being processed. The PCM DoP switch module 618 may then mute the PCM volume control module 620. For example, the PCM DoP switch module 618 may apply a high voltage to a mute connector between the PCM DoP switch module 618 and the PCM volume control module 620, indicating that the PCM volume control module 620 should mute. After detecting the high voltage, the PCM volume control module 620 may either decrease volume gradually until muted or may instantaneously mute. The PCM volume control module 620 may acknowledge receipt of the signal and subsequent muting by applying a high voltage to a mute acknowledge connector. The PCM DoP switch module 618 may also unmute the DSD volume control module 616. For example, the PCM DoP switch module 618 may apply a low voltage to a mute connector between the PCM DoP switch module 618 and the DSD volume control module 616, indicating that the DSD volume control module 616 should unmute. After detecting the low voltage, the DSD volume control module 616 may raise volume gradually until reaching a desired level or may instantaneously raise volume to the desired level. The DSD volume control module 616 may acknowledge receipt of the low voltage and subsequent unmuting by applying a low voltage to a mute acknowledge connector.

If the DoP detector 608 does not detect a sufficient number of frames including DoP marker bytes, or detects a frame missing a DoP marker byte, the DoP detector 608 may inform the PCM DoP switch module 618 that the audio data stream is not a DoP signal. For example, the DoP detector 608 may inform the PCM DoP switch module 618 that the audio data stream is a PCM signal. The PCM DoP switch module 618 may then mute the DSD volume control module 616. For example, the PCM DoP switch module 618 may apply a low voltage to a mute connector between the PCM DoP switch module 618 and the DSD volume control module 616, indicating that the DSD volume control module 616 should mute. After detecting the high voltage, the DSD volume control module 616 may either decrease its volume gradually until muted or may instantaneously mute. The DSD volume control module 616 may acknowledge receipt of the low voltage and subsequent muting by applying a low voltage to a mute acknowledge connector. The PCM DoP switch module 618 may also unmute the PCM volume control module 620. For example, the PCM DoP switch module 618 may apply a low voltage to a mute connector between the PCM DoP switch module 618 and the PCM volume control module 620, indicating that the PCM volume control module 620 should unmute. After detecting the low voltage, the PCM volume control module 620 may raise volume gradually until reaching a desired level or may instantaneously raise volume to the desired level. The PCM volume control module 620 may acknowledge receipt of the high voltage and subsequent unmuting by applying a high voltage to a mute acknowledge connector.

The audio data stream may be received by a DSD Rx port module 610 after passing through the DOP detector 608 of the first path 602. The audio data stream is then passed from the DSD Rx port module to a DSD first-in-first-out (FIFO) buffer module 612. The audio data stream then passes through a DSD filter 614 to decode the signal. The audio data stream then passes through the DSD volume control module 616. If the audio data stream is determined to be a DoP signal by the DoP detector 608, the DSD volume control module 616 may be unmuted, and the processed signal passed from the first path 602 to the summer 628 and output at output node 630. If the audio data stream is determined to be a PCM signal by the DoP detector 608, the DSD volume control module 616 may be muted, and the processed signal is blocked from passing to the summer 628.

The audio data stream received at the input node 606 may also be passed to the second path 604 for processing PCM audio signals. An initial block of the second path 604 is PCM volume control module 620. If the audio data stream is determined to be a PCM signal by the DoP detector 608, the PCM volume control module 620 may be unmuted. The signal is then passed to the PCM filter 622 to be processed by the remainder of the second path 604. In some embodiments, the DoP detector 608 may determine that the audio data stream is not a DoP signal before unmuting the PCM volume control module 620. If the audio data stream is determined to be a DoP signal by the DoP detector 608, the PCM volume control module 620 is muted, and the signal blocked from passing to the PCM filter module 622 and being processed by the remainder of the second path 604.

The signal passes through the PCM volume control module 620 of the second path 604 for processing by the PCM filter module 622. After being processed by the PCM filter 622, the signal may be passed to a PCM FIFO buffer module 612. The signal may then be passed to summer 628 and from summer 628 to output node 630. Thus, the circuit 600 may output only one signal at summer 628, processed using the appropriate audio path, depending on whether an audio data stream received at the input 606 of the circuit 600 is a PCM audio signal or a DoP audio signal. For example, the circuit 600 may output the signal at an output node 630 coupled to a digital-to-analog converter (DAC) to convert the signal from a digital audio signal to an analog audio signal.

Figure 7:
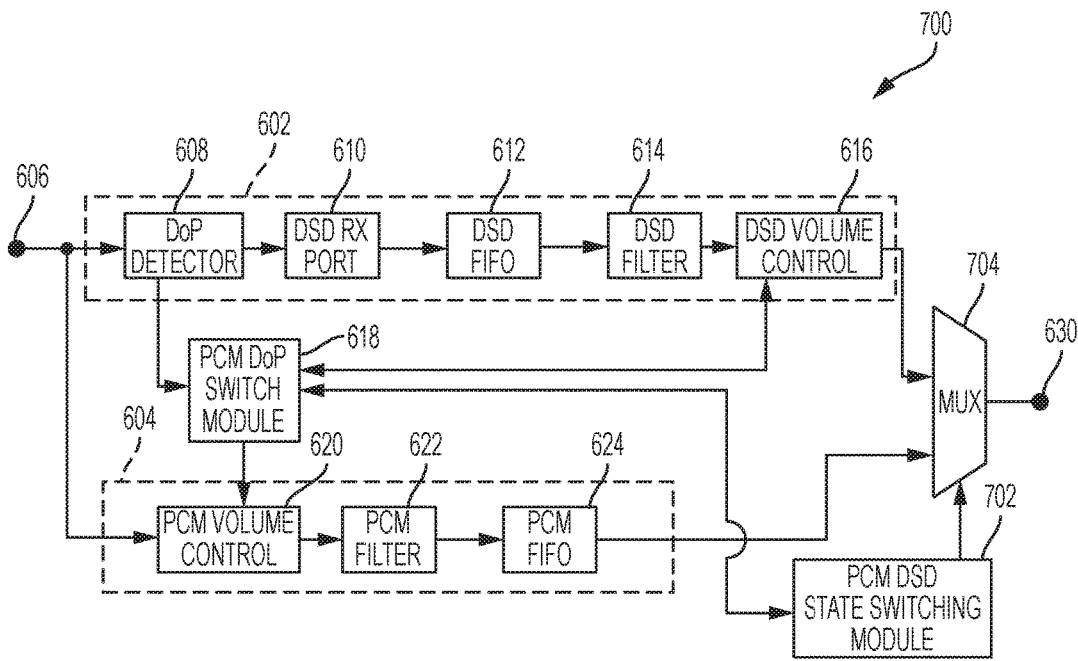
FIG. 7 is another example schematic block diagram illustrating an auto-mute audio path selection circuit according to some embodiments of the disclosure.

A multiplexer may also be included in an audio circuit to select an audio processing path for output. An example circuit 700 containing a multiplexer 704 for selecting between audio processing paths 602, 604 is illustrated in FIG. 7. Instead of a summer 628, as in FIG. 6, a multiplexer 704, controlled by a PCM DSD state switching module 702, may be located between an output of a first audio processing path 602 and an output of a second audio processing path 604 and an output node 630 of an audio processing circuit 700. In some embodiments, the PCM DSD state switching module 702 may be integrated into the PCM DoP switch module 618.

When the DoP detector 608 determines that an audio data stream received at node 606 is a PCM audio signal, the PCM DoP switch module 618 may, in addition to muting the first path 602 and unmuting the second path 604, direct the PCM DSD switching state module 702 to switch the multiplexer 704 to output a signal received from the second path 604 and to block output of a signal received from the first path 602. For example, when an audio data stream is determined to be a PCM audio signal by the DoP detector 608, the PCM DoP switch module 618 may send a mute signal to the DSD volume control module 616. The DSD volume control module 616 may then send a mute acknowledge signal to the PCM DoP switch module 618 when it has muted its signal output. When the PCM DoP switch module 618 receives the mute acknowledge signal, it may send a signal to the PCM DSD state switching module 702 instructing it to deselect or block an output from the first audio signal processing path 602. The PCM DSD state switching module 702 may then acknowledge the receipt of the instruction. When the PCM DoP switch module 618 receives the acknowledgement, it may send a signal to the PCM volume control module 620 of the second path to unmute. The PCM volume control module 620 may acknowledge the receipt of the unmute signal, when it has unmuted. When the PCM DoP switch module 618 receives the acknowledgement of the unmute signal from the PCM volume control module 620, it may send a signal to the PCM DSD state switching module 702 instructing it to select or unblock an output from the second audio signal processing path 602. The PCM DSD state switching module 702 may then cause the multiplexer to allow the output of the second audio processing path 604 to pass through, thus outputting the processed PCM signal at the output 630.

Likewise, when the DoP detector 608 determines that an audio data stream received at node 606 is a DoP audio signal, the PCM DoP switch module 618 may, in addition to muting the second path 604 and unmuting the first path 602, direct the PCM DSD state switching module 702 to switch the multiplexer 704 to output a signal received from the first path 602 and to block a signal received from the second path 604. The audio processing circuit 700 may switch an output of the circuit in response to a determination that an audio data stream is a DoP audio signal by a process similar to the process described above in response to the determination that the signal is a PCM audio signal. Thus, the audio processing circuit 700 may both mute a path based on a type of a received signal and select a path for output from circuit 700 based on the type of the received signal.

Figure 8:
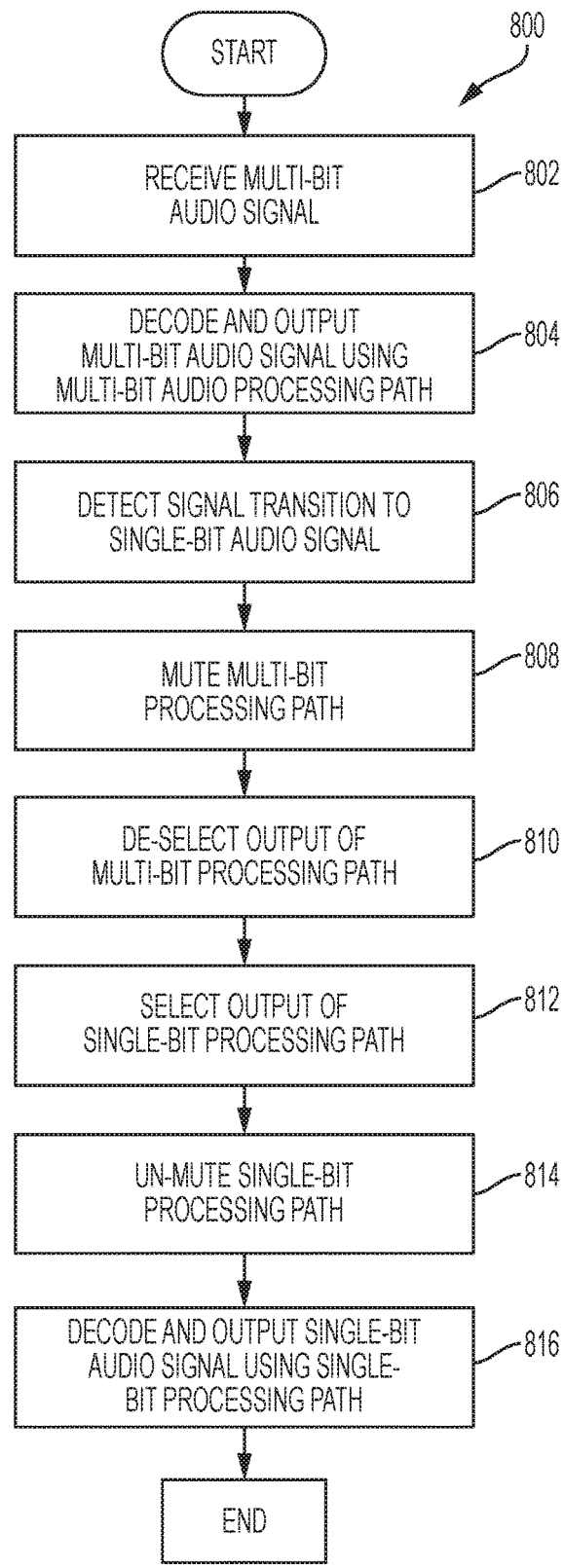
FIG. 8 is an example flow chart illustrating a method for muting a multi-bit audio processing path, selecting a single-bit audio processing path, and unmuting the single-bit audio processing path upon detection of a single-bit audio signal according to some embodiments of the disclosure.

An audio processing circuit may select and deselect an output of an audio processing path for output from the audio processing circuit based on a type of an audio signal received at an input of the audio processing circuit. An example method for automatically muting an audio processing path and selecting a different audio processing path for output from an audio processing circuit is illustrated in FIG. 8. The method 800 may begin, at step 802, with receiving a multi-bit audio signal. Following the receipt of the multi-bit audio signal, the signal may be decoded, at step 804 using a multi-bit audio signal processing path. Once the signal is decoded using the multi-bit audio signal processing path, the signal may be output from an audio signal processing circuit.

While the signal is being decoded, it may also be monitored for a change in format, for example a change from a PCM format to a DoP format. At step 806, a transition from a multi-bit audio signal format to a single-bit audio signal may be detected. When such a transition is detected, the multi-bit audio processing path may be muted, at step 808, to prevent the audio signal from being output using the wrong audio processing path. After the multi-bit audio processing path has been muted, the multi-bit audio processing path may be deselected, at step 810, to prevent any output from the multi-bit audio signal processing path from being output from the audio processing circuit. After deselecting the multi-bit audio processing path, single-bit audio processing path may be selected for output, at step 812, to allow an audio signal processed using the single-bit audio processing path to be output from the audio processing circuit. At step 814, the single-bit audio processing path may be unmuted, to allow an audio signal processed by the selected single-bit audio processing path to be passed through a volume control module. After the single-bit audio processing path has been unmuted and selected, the audio signal may be decoded, at step 816, using the single-bit audio processing path and output from the audio processing circuit. Similarly, when a transition from a single-bit audio signal to a multi-bit audio signal is detected, a single-bit audio processing path may be muted before it is deselected, and a multi-bit audio processing path may be selected for output from an audio processing circuit before it is unmuted. By muting an inappropriate audio processing path before deselecting it, noise that may be introduced to the output in deselecting an output of an audio processing path while the audio processing path is not muted may be reduced. Thus, in addition to muting an inappropriate audio signal processing path and unmuting an appropriate audio signal processing path, an output of an appropriate audio processing path may be selected while an output of an inappropriate audio processing path may be deselected.

Figure 9:
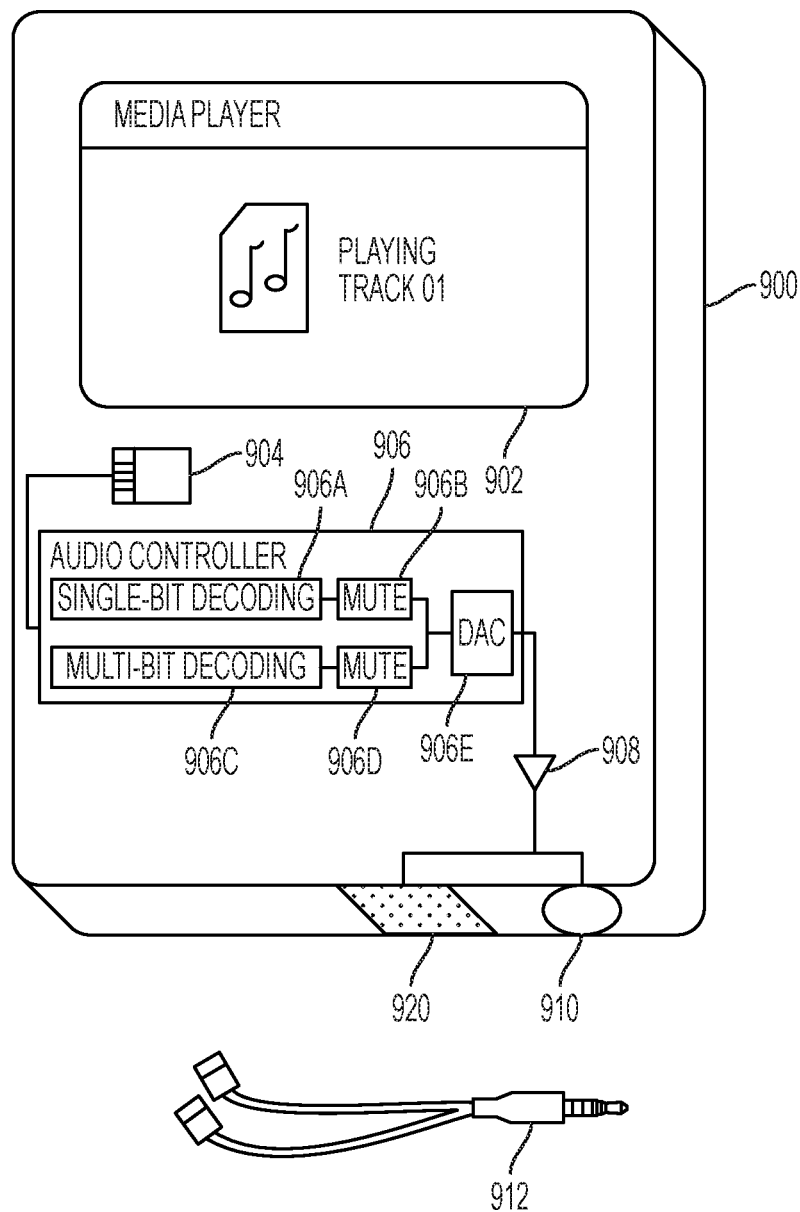
FIG. 9 is an illustration showing an example personal media device for audio playback including an auto-mute audio path selection circuit according to some embodiments of the disclosure.

Multi-path audio processing circuits with auto-mute path selection functionality may be found in a variety of devices such as portable media players, cell phones, laptop computers, stereo systems, and other devices that convert stored audio data into an audio output. One advantageous embodiment for an audio processing circuit described herein is a personal media device for playing back music, high-fidelity music, and/or speech from telephone calls. FIG. 9 is an illustration showing an example personal media device for audio playback including a multi-path audio processing circuit with auto-mute functionality according to one embodiment of the disclosure. A personal media device 900 may include a display 902 for allowing a user to select from music files for playback, which may include both high-fidelity music files and normal music files. When music files are selected by a user, audio files, such as audio files encoded in a PCM or DoP format, may be retrieved from memory 904 by an application processor (not shown) and provided to an audio controller 906. The audio controller 906 may include a first audio processing path including a single-bit audio signal decoding module 906A and a single-bit audio signal mute module 906B, a second audio processing path including a multi-bit audio signal decoding module 906B and a multi-bit audio signal mute module 906D. The first and second path may both output to a DAC 906E. The DAC 906E may operate continuously during a transition of the audio controller 906 from processing an audio signal with the first path to processing the audio signal with the second path. For example, the audio controller 906 may include a multi-path audio processing circuit with auto-mute functionality, such as according to the embodiments of FIG. 3, FIG. 4, FIG. 5 FIG. 6, FIG. 7, or FIG. 8. The digital audio (e.g., music or speech) may be converted to analog signals by the audio controller 906, and those analog signals may be amplified by an amplifier 908. The amplifier 908 may be coupled to an audio output 910, such as a headphone jack, for driving a transducer, such as headphones 912. The amplifier 908 may also be coupled to an internal speaker 920 of the device 900. Although the data received at the audio controller 906 is described as received from memory 904, the audio data may also be received from other sources, such as a USB connection, a device connected through Wi-Fi to the personal media device 900, a cellular radio, an Internet-based server, another wireless radio, and/or another wired connection.

The operations described above may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor (e.g., CPU or DSP) capable of executing instructions contained in software. The firmware and/or software may include instructions that cause the processing of signals described herein to be performed. The circuitry or software may be organized as blocks that are configured to perform specific functions. Alternatively, some circuitry or software may be organized as shared blocks that can perform several of the described operations. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The described methods are generally set forth in a logical flow of steps. As such, the described order and labeled steps of representative figures are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although ones (1s) and zeros (0s) or highs and lows are given as example bit values throughout the description, the function of ones and zeros may be reversed without change in operation of the processor described in embodiments above. As another example, where general purpose processors are described as implementing certain processing steps, the general purpose processor may be digital signal processors (DSPs), graphics processing units (GPUs), central processing units (CPUs), or other configurable logic circuitry. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
decoding an audio data stream as a multi-bit audio signal using a multi-bit audio processing path coupled to an input node shared with a single-bit audio processing path;
detecting when the audio data stream switches from the multi-bit audio signal to a single-bit audio signal; and
muting the multi-bit audio processing path after detecting the audio data stream switches to the single-bit audio signal.

2. The method of claim 1, wherein the step of detecting is performed by simultaneously decoding the audio data stream in the single-bit audio processing path.

3. The method of claim 1, further comprising decoding the audio data stream using the single-bit audio processing path after muting the multi-bit audio processing path.

4. The method of claim 3, further comprising:
detecting when the audio data stream switches from the single-bit audio signal to the multi-bit audio signal;
muting the single-bit audio processing path after detecting the audio data stream switches to the multi-bit audio signal; and
decoding the audio data stream using the multi-bit audio processing path.

5. The method of claim 3, further comprising: deselecting the multi-bit audio processing path for output prior to muting the multi-bit audio processing path and selecting the single-bit audio processing path for output after deselecting the multi-bit audio processing path.

6. The method of claim 3, wherein the step of detecting when the audio data stream switches to the single-bit audio signal comprises detecting, in the audio data stream, a marker byte, the presence of the marker byte indicating the audio data stream is the single-bit audio signal.

7. The method of claim 3, further comprising amplifying an output of the decoded audio stream from the multi-bit audio processing path for driving a transducer to reproduce audio of the decoded audio stream, wherein the output is amplified during switching from the multi-bit audio processing path to the single-bit audio processing path.

8. The method of claim 3, wherein the muting of the multi-bit audio processing path is performed immediately after detecting the single-bit audio signal without ramping down a volume of the multi-bit audio processing path.

9. The method of claim 1, wherein the step of detecting comprises detecting, in the audio data stream, a threshold number of marker bytes in a predetermined number of frames indicating the audio data stream is the single-bit audio signal.

10. The method of claim 1, further comprising ramping down a volume of the of the multi-bit audio processing path prior to muting the multi-bit audio processing path.

11. A method, comprising:
decoding an audio data stream as a single-bit audio signal using a single-bit audio processing path coupled to an input node shared with a multi-bit audio processing path;
detecting when the audio data stream switches from the single-bit audio signal to a multi-bit audio signal; and
muting the single-bit audio processing path after detecting the audio data stream switches to the multi-bit audio signal.

12. The method of claim 11, further comprising decoding the audio data stream using the multi-bit audio processing path after muting the single-bit audio processing path.

13. The method of claim 12, further comprising deselecting the single-bit audio processing path for output prior to muting the single-bit audio processing path and selecting the multi-bit audio processing path for output after deselecting the single-bit audio processing path.

14. The method of claim 12, wherein the step of detecting when the audio data stream switches to the multi-bit audio signal comprises detecting, in the audio data stream, a missing marker byte, the absence of the marker byte indicating that the audio data stream is the multi-bit audio signal.

15. The method of claim 12, further comprising amplifying an output of the decoded audio stream from the single-bit audio processing path for driving a transducer to reproduce audio of the decoded audio stream, wherein the output is amplified during switching from the single-bit audio processing path to the multi-bit audio processing path.

16. The method of claim 12, wherein the muting of the single-bit audio processing path is performed immediately after detecting the multi-bit audio signal without ramping down a volume of the single-bit audio processing path.

17. The method of claim 11, further comprising ramping down a volume of the of the single-bit audio processing path prior to muting the single-bit audio processing path.

18. An apparatus, comprising:
an audio controller configured to perform steps comprising:
decoding an audio data stream as a multi-bit audio signal using a multi-bit audio processing path coupled to an input node shared with a single-bit audio processing path;
detecting when the audio data stream switches from the multi-bit audio signal to a single-bit audio signal; and
muting the multi-bit audio processing path after detecting the audio data stream switches to the single-bit audio signal.

19. The apparatus of claim 18, wherein the step of detecting is performed by simultaneously decoding the audio data stream in the single-bit audio processing path.

20. The apparatus of claim 18, wherein the audio controller is further configured to perform steps comprising: decoding the audio data stream using the single-bit audio processing path after muting the multi-bit audio processing path.

21. The apparatus of claim 20, wherein the audio controller is further configured to perform steps comprising:
detecting when the audio data stream switches from the single-bit audio signal to the multi-bit audio signal;
muting the single-bit audio processing path after detecting the audio data stream switches to the multi-bit audio signal; and
decoding the audio data stream using the multi-bit audio processing path.

22. The apparatus of claim 20, wherein the controller is further configured to perform steps comprising: deselecting the multi-bit audio processing path for output prior to muting the multi-bit audio processing path and selecting the single-bit audio processing path for output after deselecting the multi-bit audio processing path.

23. The apparatus of claim 20 wherein the step of detecting when the audio data stream switches to the single-bit audio signal comprises detecting, in the audio data stream, a marker byte, the presence of the marker byte indicating the audio data stream is the single-bit audio signal.

24. The apparatus of claim 20, wherein the controller is further configured to perform steps comprising amplifying an output of the decoded audio stream from the multi-bit audio processing path for driving a transducer to reproduce audio of the decoded audio stream, wherein the output is amplified during switching from the multi-bit audio processing path to the single-bit audio processing path.

25. The apparatus of claim 20, wherein the muting of the multi-bit audio processing path is performed immediately after detecting the single-bit audio signal without ramping down a volume of the multi-bit audio processing path.

26. The apparatus of claim 18, wherein the step of detecting comprises detecting, in the audio data stream, a threshold number of marker bytes in a predetermined number of frames indicating the audio data stream is the single-bit audio signal.

27. The apparatus of claim 18, wherein the controller is further configured to perform steps comprising: ramping down a volume of the of the multi-bit audio processing path prior to muting the multi-bit audio processing path.

28. An apparatus, comprising:
an audio controller configured to perform steps comprising:
decoding an audio data stream as a single-bit audio signal using a single-bit audio processing path coupled to an input node shared with a multi-bit audio processing path;
detecting when the audio data stream switches from the single-bit audio signal to a multi-bit audio signal; and
muting the single-bit audio processing path after detecting the audio data stream switches to the multi-bit audio signal.

29. The apparatus of claim 28, wherein the controller is further configured to perform steps comprising: decoding the audio data stream using the multi-bit audio processing path after muting the single-bit audio processing path.

30. The apparatus of claim 29, wherein the controller is further configured to perform steps comprising: deselecting the single-bit audio processing path for output prior to muting the single-bit audio processing path and selecting the multi-bit audio processing path for output after deselecting the single-bit audio processing path.

31. The apparatus of claim 29, wherein the step of detecting when the audio data stream switches to the multi-bit audio signal comprises detecting, in the audio data stream, a missing marker byte, the absence of the marker byte indicating that the audio data stream is the multi-bit audio signal.

32. The apparatus of claim 29, further comprising amplifying an output of the decoded audio stream from the single-bit audio processing path for driving a transducer to reproduce audio of the decoded audio stream, wherein the output is amplified during switching from the single-bit audio processing path to the multi-bit audio processing path.

33. The apparatus of claim 29, wherein the muting of the single-bit audio processing path is performed immediately after detecting the multi-bit audio signal without ramping down a volume of the single-bit audio processing path.

34. The apparatus of claim 28, wherein the controller is further configured to perform steps comprising: ramping down a volume of the of the single-bit audio processing path prior to muting the single-bit audio processing path.

* * * * *